(12) United States Patent
Matsuda

(10) Patent No.: US 8,919,481 B2
(45) Date of Patent: Dec. 30, 2014

(54) SADDLE-TYPE ELECTRIC VEHICLE

(75) Inventor: Yoshimoto Matsuda, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 0 days.

(21) Appl. No.: 13/976,451

(22) PCT Filed: Dec. 27, 2010

(86) PCT No.: PCT/JP2010/007551
§ 371 (c)(1),
(2), (4) Date: Jun. 26, 2013

(87) PCT Pub. No.: WO2012/090241
PCT Pub. Date: Jul. 5, 2012

(65) Prior Publication Data
US 2013/0270024 A1 Oct. 17, 2013

(51) Int. Cl.
*B62K 11/00* (2006.01)
*B60L 11/18* (2006.01)
*H05K 7/20* (2006.01)
*B60L 7/14* (2006.01)

(52) U.S. Cl.
CPC ............ *B62K 11/00* (2013.01); *B60L 11/1877* (2013.01); *H05K 7/20927* (2013.01); *B60L 7/14* (2013.01); *B60L 11/1803* (2013.01); *B60L 11/1864* (2013.01); *B60L 11/1874* (2013.01); *B60L 11/1879* (2013.01); *B60Y 2400/61* (2013.01); *B62K 2204/00* (2013.01); *B62K 2208/00* (2013.01); *B60L 2200/12* (2013.01); *Y02T 10/7005* (2013.01); *Y02T 10/705* (2013.01); *Y02T 10/70* (2013.01); *B60L 2270/145* (2013.01)
USPC ........................................ 180/220

(58) Field of Classification Search
CPC .................................................. B60L 11/1892
USPC .............. 180/65.1, 65.8, 68.5, 220, 907, 908
See application file for complete search history.

(56) References Cited

U.S. PATENT DOCUMENTS

2003/0010551 A1* 1/2003 Shirazawa .................... 180/65.6
2010/0097765 A1* 4/2010 Suzuki et al. ................. 361/699

FOREIGN PATENT DOCUMENTS

EP     1234761 A2    8/2002
EP     1830406 A1    9/2007
(Continued)

OTHER PUBLICATIONS

Japanese Patent Office, International Search Report of PCTJP2010007551, Apr. 12, 2011, WIPO, 1 pages.

(Continued)

*Primary Examiner* — Joseph M Rocca
*Assistant Examiner* — Felicia L Brittman
(74) *Attorney, Agent, or Firm* — Alleman Hall McCoy Russell & Tuttle LLP

(57) ABSTRACT

In a saddle-type electric vehicle (e.g., electric motorcycle) including a driving motor and an electric power control unit for controlling electric power supply to the motor, a substrate of a power module to which a semiconductor element such as an IGBT is mounted is accommodated into a case of an electric power control unit such that the substrate is positioned in close proximity to a wall portion of the case, and a cooling jacket is provided such that the coolant contacts the wall portion. A cooler may be mounted such that it closes an opening provided in the case. A desired cooling capability is attained while reducing a size of the cooler to a required size and an amount of the coolant to a required amount and suppressing a weight increase and a cost increase.

18 Claims, 7 Drawing Sheets

(56) References Cited

FOREIGN PATENT DOCUMENTS

| | | |
|---|---|---|
| JP | 2001114173 A | 4/2001 |
| JP | 2001155749 A | 6/2001 |
| JP | 2006076496 A | 3/2006 |
| JP | 2008131672 A | 6/2008 |
| WO | 2010109969 A1 | 9/2010 |

OTHER PUBLICATIONS

European Patent Office, Extended European Search Report of EP10861465, Germany, Apr. 23, 2014, 7 pages.

* cited by examiner

SADDLE-TYPE ELECTRIC VEHICLE

TECHNICAL FIELD

The present invention relates to a saddle-type electric vehicle including an electric motorcycle incorporating an electric motor as a driving source, an ATV (all terrain vehicle) incorporating the electric motor as the driving source, and a hybrid electric vehicle incorporating an engine in addition the electric motor. Particularly, the present invention relates to a structure for cooling an electric power controller.

BACKGROUND ART

With increasing awareness about the environment and in view of depleted oil sources in the future, there has been a need for reduction of fuel consumption in automobiles, motorcycles, etc. Also, secondary batteries such as a lithium ion battery have been making remarkable progresses. Attempts to use electric power as driving power in electric automobiles, hybrid automobiles, etc., have been vigorously made.

In a case where the electric power is used as the driving power for the vehicle, heat generation in the electric motor in which a current of a great magnitude flows or in an inverter (electric power controller) for supplying the electric power to the electric motor becomes problematic. Therefore, it is necessary to efficiently disperse the heat generated in an electromagnetic coil of a stator in the electric motor, a switching element of the inverter, etc., to cool the electric motor, the inverter, etc.

Under the circumstances, conventionally, various structures for liquid-cooling the electric motor and the inverter in the electric vehicles have been proposed. For example, in a cooling structure disclosed in Patent Literature 1, a housing of a motor unit is cooled by a coolant (LLC) in an electric vehicle of a four-wheeled automobile type. The housing is provided with an accommodating section of the electric motor, and an accommodating section for accommodating an inverter and a smoothing capacitor. A module of the inverter and a module of the capacitor which are accommodated in the accommodating section are configured to contact a cooling jacket.

In a motorcycle in which a space for a cooling system is limited, for example, as disclosed in Patent Literature 2, an inverter is air-cooled in many cases. In an electric motorcycle of a scooter type disclosed in Patent Literature 2, a motor controller (electric power controller) is provided under a floor of a battery box accommodating a number of batteries. The motor controller is cooled by traveling wind. In addition, the battery box is provided with an air discharge port which opens toward the motor controller to directly apply discharged air to the motor controller.

CITATION LIST

Patent Literature

Patent Literature 1: Japanese Laid-Open Patent Application Publication No. 2008-131672
Patent Literature 2: Japanese Laid-Open Patent Application Publication No. 2001-114173

SUMMARY OF THE INVENTION

Technical Problem

Among saddle-type electric vehicles such as the electric motorcycle, a sport type electric vehicle which has a high motion performance is required to provide a greater output or instantaneous power, unlike the scooter type electric vehicle disclosed in Patent Literature 2. This causes a possibility that a current supplied to the electric motor increases, and therefore the inverter cannot be cooled sufficiently when it is cooled only using the traveling wind and the air discharged from the battery box.

Since the saddle-type electric vehicle has a limited space for the cooling system as described above, there is a need for a small-sized and lightweight cooling system. To realize this, the cooling jacket for cooling the electric motor may possibly be used to cool the electric power controller, as in the example in Patent Literature 1. However, a magnitude of a heat load and a suitable temperature are different between the electric motor and the electric power converter. Therefore, it is difficult to say that they can be cooled optimally using the cooling jacket for cooling the electric motor.

An object of the present invention is to configure a cooling system unit compactly while enhancing an ability to cool an electric power controller and avoiding its weight increase and its cost increase so that the cooling system unit is incorporated into a sport type saddle-type electric vehicle.

Solution to Problem

To achieve the above objective, a saddle-type electric vehicle of the present invention comprises an electric motor for driving electric vehicle; and an electric power controller for controlling electric power supply to the electric motor; wherein a substrate of a power module to which a semiconductor element is mounted is accommodated into a case of the electric power controller; and wherein the case of the electric power controller is provided with a cooling jacket which is in contact with at least a portion of the substrate.

The substrate of the power module which raises its temperature as an operation of the semiconductor element proceeds is accommodated into the case of the electric power controller. With the above described configuration, at least a portion of the substrate is in contact with the cooling jacket, and hence is cooled efficiently. Therefore, a size of the cooling jacket can be reduced to a required size and an amount of a coolant can be reduced to a required amount. Thus, a cooling capability of the electric power controller can be ensured while suppressing a weight increase and a cost increase.

Preferably, the cooling jacket may be mounted to close an opening formed in the case of the electric power controller such that the cooling jacket is in contact with at least a portion of the substrate of the power module. Since the cooling jacket which is a separate component is mounted to the case and a portion of its outer wall serves as a portion of a wall portion of the case of the electric power controller, a desired and necessary cooling capability can be ensured merely by changing the cooling jacket without changing the case even in a case where a desired cooling capability changes depending on the weight of the electric motor, the size of the electric motor, etc.

In that case, the opening of the case of the electric power controller may be formed to correspond to a portion of the substrate of the power module instead of the entire substrate of the power module, and only this portion may be caused to contact the cooling jacket. That is, instead of cooling the entire substrate, only the portion corresponding to the switching element which generates heat of a great amount is caused to contact the cooling jacket to be concentrically cooled. This makes it possible to reduce a size of the cooling jacket to a requisite minimum size and an amount of a coolant to a requisite minimum amount.

The cooling jacket which is a separate component may be detachably attached to the case of the electric power controller. With this configuration, it becomes possible to detach only the cooling jacket from the case of the electric power controller. Thus, maintenance can be carried out easily.

The case of the electric power controller may be provided with a fitting portion into which the cooling jacket is fitted from outward; and the opening may be formed within the fitting portion. With this configuration, the cooling jacket mounted to the case of the electric power controller does not protrude with a great amount outward from the case and hence is easily mounted into the motorcycle having a limited space.

For example, in a case where a vehicle body frame of the electric vehicle includes a head pipe and a main frame extending rearward from the head pipe such that the main frame is inclined downward, a plurality of electric storage devices for storing electric power supplied to the electric motor is accommodated into an accommodating box which is mounted to the main frame; the case of the electric power controller may be mounted to a lower surface of the accommodating box, and the cooling jacket may be disposed in a relatively upper portion inside of the case.

With this configuration, the lower surface of the case of the electric power controller mounted to the lower surface of the accommodating box of the electric storage device is cooled by the traveling wind, while the upper portion of the case above which the accommodating box is located can be cooled efficiently by the cooling jacket. That is, the entire case is cooled by the traveling wind, while the substrate of the power module which generates heat of a great amount is cooled surely by the cooling jacket. Since the traveling wind can be efficiently used to cool the case in this way, a volume of the cooling jacket can be reduced.

As the coolant used in the cooling jacket, the oil for cooling the electric motor or lubricating oil may be used. A motor unit including the electric motor and a power transmission mechanism for transmitting an output of the electric motor may be provided with an oil pump which discharges lubricating oil. The electric power controller may be disposed above the motor unit. The cooling jacket of the electric power controller may be provided with an oil feeding line through which the oil is fed as a coolant from the oil pump, and an oil return line through which the oil discharged from the cooling jacket flows downward to the motor unit.

In this configuration, the oil pump feeds the oil with a pressure to the electric power controller disposed above the motor unit to cool the substrate of the power module, and then the oil flows downward naturally and is returned to the motor unit. By positioning the electric power controller as close to the motor unit as possible in a location above the motor unit, a loss caused by actuating the oil pump can be lessened. Because of this, the cooling jacket may be disposed in a relatively lower portion inside of the case of the electric power controller.

The cooling jacket may include a passage having a labyrinth structure in which a flow of the cooling water is turned back. This makes it easier to separate a boundary layer of the cooling water from a wall surface of the passage. Thus, efficiency of the heat exchange can be increased.

Advantageous Effects of the Invention

In accordance with the present invention, in an electric power controller of a saddle-type electric vehicle, a dedicated cooling jacket is provided as close to a substrate of a power module of a great heat generation amount as possible, and a coolant is caused to contact a wall portion which is in close proximity to the substrate. Thus, a desired cooling capability is attained while reducing a size of the cooling jacket to a required size and an amount of the coolant to a required amount and suppressing a weight increase and a cost increase. In addition, a cooling capability can be enhanced by utilizing traveling wind. By using lubricating oil of the electric motor as the coolant, the weight increase and the cost increase can be further suppressed.

DESCRIPTION OF THE EMBODIMENTS

Hereinafter, an electric motorcycle according to an embodiment of the present invention will be described with reference to the drawings. The stated directions recited below are from the perspective of a driver straddling the electric motorcycle.

Schematic Configuration of Electric Motorcycle

Figure 1:
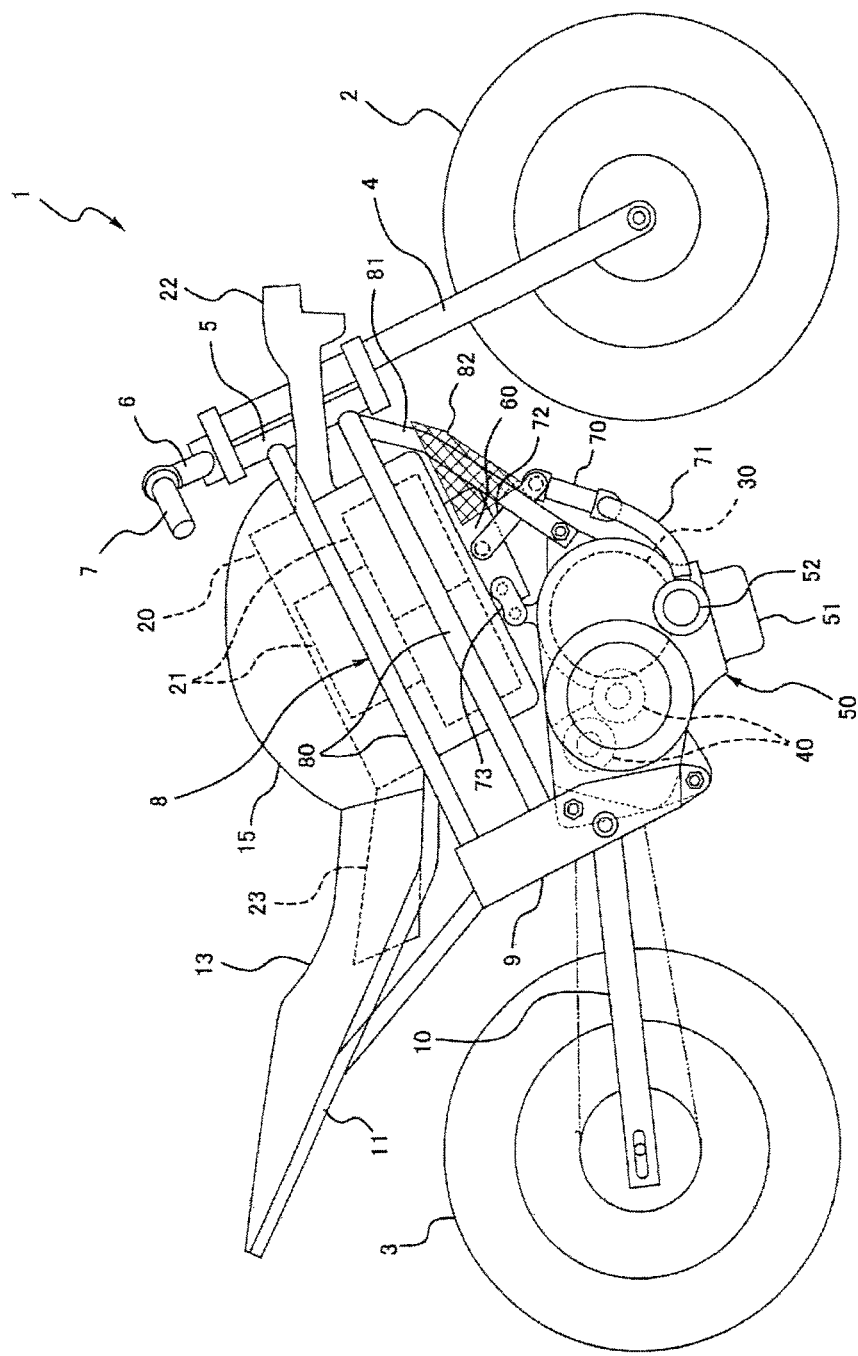
FIG. 1 is a right side view showing major components in an electric motorcycle according to an embodiment of the present invention.

FIG. 1 is a right side view schematically showing major components such as a vehicle body frame, a power plant, and wheels, in an electric motorcycle 1 (electric vehicle) according to an embodiment of the present invention. As shown in FIG. 1, the electric motorcycle 1 includes a front wheel 2 which is a steering wheel and a rear wheel 3 which is a drive wheel. The front wheel 2 is rotatably mounted to lower end portions of a pair of right and left front forks 4 extending substantially vertically. Upper portions of the front forks 4 are mounted to a steering shaft (not shown) via a pair of upper and lower brackets 4a.

The steering shaft is rotatably supported in a state in which the steering shaft is inserted into a head pipe 5 mounted to a vehicle body, and constitutes a steering shaft. A handle 6 extending in a rightward and leftward direction is attached to the upper bracket 4a. When the driver steers the handle 6, the front forks 4 and the front wheel 2 can be steered around the steering shaft. The handle 6 is provided at a right end with an accelerator grip 7 which is gripped by the driver's right hand and rotated by twisting the driver's wrist.

The vehicle body frame of the electric motorcycle 1 includes a main frame 8 extending rearward from the head pipe 5 such that the main frame 8 is tilted slightly downward. For example, the main frame 8 is divided into two parts, i.e., right and left parts, at a front end portion thereof welded to the head pipe 5. The right and left parts are each composed of pipe members 80 arranged at upper and lower sides. The pipe members 80 extend rearward from the head pipe 5, extend rightward and leftward, are curved inward, and then extend rearward such that the pipe members 80 corresponding to the right part are apart from the pipe members 80 corresponding to the left part. Then, the pipe members 80 are curved inward and then rear end portions thereof are coupled to a pivot frame 9.

The pivot frame 9 has a substantially rectangular frame shape. The rear end portions of the pipe members 80 of the main frame 8 are joined and welded to right and left side plates of the pivot frame 9 from inward. Front end portions of a swing arm 10 supporting the rear wheel 3 are mounted between the right and left side plates of the pivot frame 9 such that the swing arm 10 is vertically pivotable. The swing arm 10 extends rearward from its pivot such that it is tilted slightly downward. The rear wheel 3 is rotatably mounted to rear end portions of the swing arm 10.

A rear frame 11 extends from the rear portions of the main frame 8 and upper end portions of the pivot frame 9 such that the rear frame 11 is inclined upward. A saddle seat 13 is mounted over the rear frame 11. A dummy tank 15 is disposed in front of the seat 13. The driver straddling the electric motorcycle 1 grips the dummy tank 15 between the driver's knees. By gripping the dummy tank 15 with the driver's knees, the driver feels unity with the electric motorcycle 1.

A battery box 20 (accommodating box of electric storage device) accommodating batteries 21 which are the electric storage device, is disposed such that the battery box 20 is covered with the dummy tank 15 from above. For example, the battery box 20 is surrounded by the four pipe members 80 of the main frame 8 from right and from left. Right and left side wall portions of the battery box 20 are fastened to the pipe members 80, respectively, by bolts, or the like.

As will be described in detail later, in the present embodiment, the batteries 21 are accommodated into the battery box 20 such that the batteries 21 are separated into right and left modules, and a traveling wind path is formed between the right and left modules. An air guide duct 22 is integrally provided on a front wall of the battery box 20 to guide the traveling wind from forward into the battery box 20 during driving of the electric motorcycle 1, while an air discharge duct 23 is integrally provided on a rear wall of the battery box 20.

For example, a front portion of the air guide duct 22 extends forward farther than the head pipe 5. The traveling wind taken in through the air guide duct 22 is guided to inside of the battery box 20, flows through a space between the right and left modules of the batteries 21, and is discharged through the air discharge duct 23. The air discharge duct 23 extends rearward through a space below the seat 13. The air is discharged smoothly rearward relative to the electric motorcycle 1 through the air discharge duct 23.

When viewed from a side as shown in FIG. 1, the battery box 20 is provided in a location close to a center of a vehicle body in a range from the head pipe 5 to the pivot frame 9 in the electric motorcycle 1, and extends along the main frame 8. That is, the battery box 20 having a great weight is mounted in the vicinity of a roll axis, which is preferable to enhance a motion performance of the electric motorcycle 1. A lower surface of the battery box 20 protrudes obliquely forward to be lower than a lower edge of the main frame 8, i.e., the lower pipe member 80, and is inclined to be gradually lower in a direction from its front edge to its rear edge.

In close proximity to and below a rear edge of the lower surface which is the lowest location of the inclined battery box 20, a motor unit 50 including a driving motor 30 constituted by an electric motor and a transmission 40 (power transmission mechanism) is disposed. A rear portion of the motor unit 50 is an accommodating section of the transmission 40. Right and left portions of the accommodating section of the transmission 40 are fastened to and supported by right and left side plates of the pivot frame 9. By comparison, a front portion of the motor unit 50 is an accommodating section of the driving motor 30. Right and left portions of the accommodating section of the driving motor 30 is supported by hanger brackets 81 extending downward from the front portion of the main frame 8.

An electric power control unit 60 (electric power controller) is disposed on the lower surface of the battery box 20 in close proximity to and above the motor unit 50. As will be described later with reference to FIG. 6, the electric power control unit 60 is configured in such a manner that a power module 61 incorporating a power semiconductor such as an IGBT (insulated-gate bipolar transistor) is accommodated into a case 62. The electric power control unit 60 is mounted to a portion of the lower surface of the battery box 20, which portion is in a range from its center to its front portion and directly receives the traveling wind flowing through a space between the right and left hanger brackets 81.

A protective net 82 (protective member) is attached over upper portions of the right and left hanger brackets 81 such that the protective net 82 covers a forward side, right and left sides, and an underside of the electric power control unit 60. The protective net 82 is formed of, for example, a metal net, a punched metal, etc., and has meshes which inhibit bouncing stones from passing therethrough, while allowing the traveling wind to pass therethrough.

An oil cooler 70 is mounted to lower portions of the right and left hanger brackets 81. As will be described later, a cooler 66 (cooling jacket) is incorporated into the electric power control unit 60. Oil is cooled by the oil cooler 70 and then is fed to the cooler 66 through an upper hose 72 (oil feeding line) to cool the power module 61. After that, the oil flows downward through a return hose 73 (oil return line) and is returned to the motor unit 50.

Although not described in detail, in the present embodiment, a case of the motor unit 50 of the present embodiment is provided with an oil pan 51 which stores oil used for lubricating and cooling the driving motor 30 and the transmission 40, and an oil pump 52 for suctioning up the oil from the oil pan 51. The oil discharged from the oil pump 52 is fed with a pressure to the oil cooler 70 via a lower hose 71 (oil feeding line). A portion of the oil discharged from the oil pump 52 is fed to bearings of the driving motor 30, clutches and gear trains of the transmission 40, to lubricate and cool them.

In the present embodiment, the driving motor 30 is a motor/generator which is capable of a motor operation and a power generation operation. The driving motor 30 operates as a motor by the electric power supplied from the batteries 21 via the electric power control unit 60, and outputs driving power to the rear wheel 3. By comparison, during regenerative braking of the electric motorcycle 1, the driving motor 30 operates as a generator to generate AC power. The AC power is converted into DC power by an inverter of the electric power control unit 60 and is stored in the batteries 21. Control for the operation of the driving motor 30 and control for charge and discharge of the batteries 21 are executed by a known method.

Mounting Structure of Batteries

Figure 2:
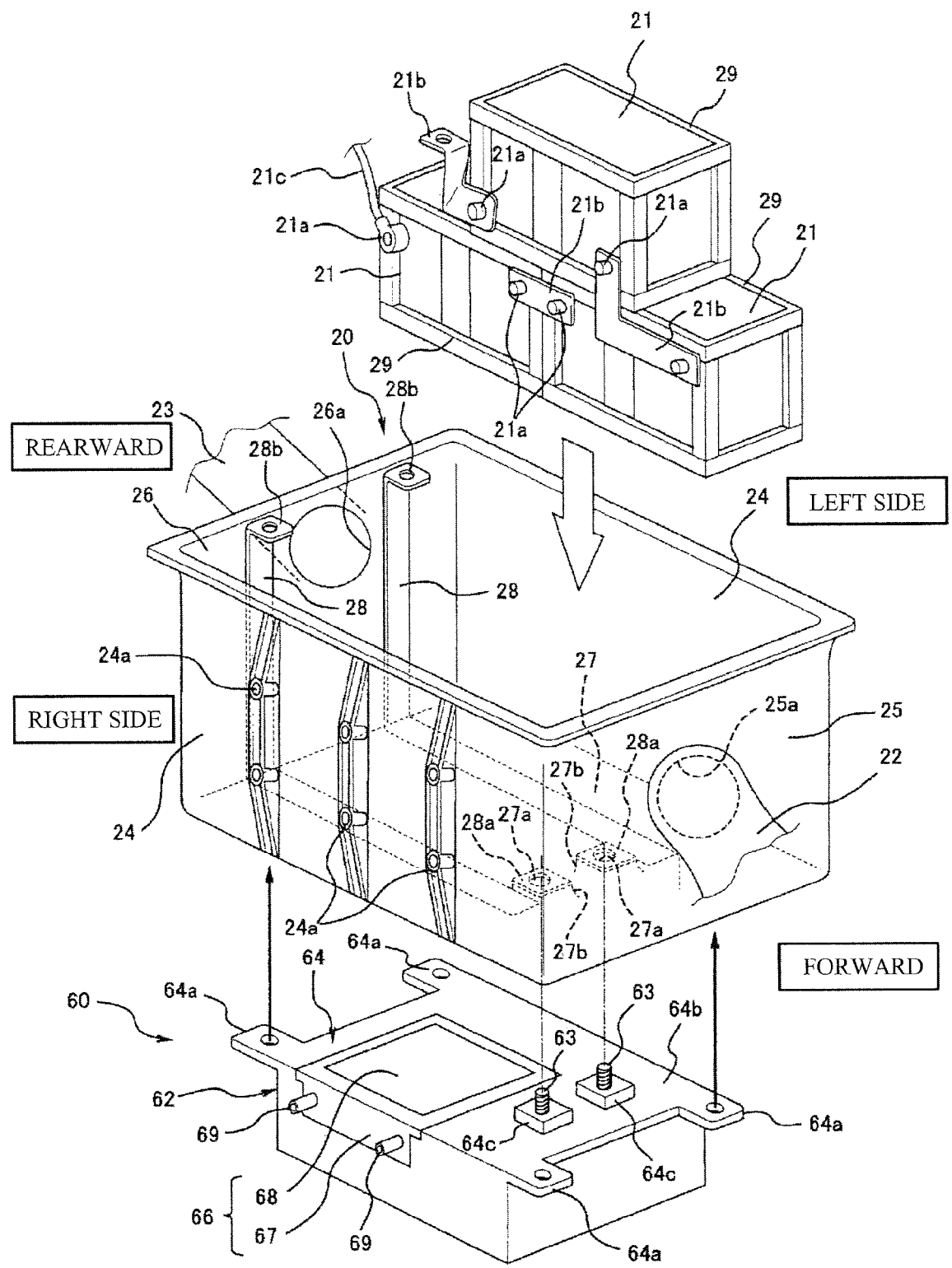
FIG. 2 is a perspective view showing a structure of a battery box.

In the present embodiment, to isolate high-voltage lines from the driver and protect them from rain water or the like, the batteries 21 are accommodated into the battery box 20 made of a resin. FIG. 2 shows a state in which the battery box 20 is detached from the main frame 8 and illustrated as a single unit. As shown in FIG. 2, the battery box 20 is a rectangular casing which opens upward and has a shape in which its width in a rightward and leftward direction is greater than its height, and a length in a forward and rearward direction is great. Right and left side wall portions 24 of the battery box 20 are integrally provided with receiving seat portions 24a of bolts to mount the side wall portions 24 of the battery box 20 to the pipe members 80 of the main frame 8. Nuts (not shown) are embedded into the receiving seat portions 24a, respectively.

A front wall portion 25 of the battery box 20 has a circular hole 25a in a substantially center portion in a vertical direction and in the rightward and leftward direction. The air guide duct 22 (see FIG. 1) extends forward from a peripheral portion of the circular hole 25a. An upper portion of the rear wall portion 26 of the battery box 20 has a circular hole 26a in a center portion in the rightward and leftward direction. The air discharge duct 23 (see FIG. 1) extends rearward from a peripheral portion of the circular hole 26a. A floor portion 27 connects lower ends of the right and left side wall portions 24, a lower end of the front wall portion 25 and a lower end of the rear wall portion 26 has a substantially rectangular shape. Bus bars 28 are provided to extend from an upper surface of the floor portion 27 to an inner surface of the rear wall portion 26.

As should be well known, the bus bars 28 are formed by molding alloy of copper or aluminum in an elongated band shape. Each of the bus bars 28 is an electric conductor in which it has connecting portions by which the bus bar 28 is connected to electrode terminals, in predetermined locations such as both end portions thereof, and a portion other than the connecting portions is coated with an insulating material. As will be described with reference to FIG. 3, the floor portion 27 of the battery box 20 has insertion holes 27a into which the electrode terminals 63 of the electric power control unit 60 are inserted. Connecting portions 28a having circular holes connected to the insertion holes 27a, respectively, are provided at one end portion of each of the bus bars 28.

Although only one module is shown in FIG. 2, for example, six batteries 21 are accommodated into the battery box 20 in a state in which the right module composed of the three batteries 21 and the left module composed of the three batteries 21 are separately placed. Each module is constructed as a detachably attachable module, in which the two rectangular batteries 21 are arranged in the forward and rearward direction of the electric motorcycle 1 and one module is placed on and above the two batteries 21 and integrally coupled to the two batteries 21 by stays 29 and the like. Positive and negative electrodes 21a are provided for each of the batteries 21 on a side surface (right side surface shown at a near side in FIG. 2 in the case of the left module in FIG. 2), which surface faces inside of a vehicle body during storage, and are connected to each other by the bus bar 21b.

The three batteries 21 are connected in series. A negative terminal of the battery 21 at an upper side which is lowest in electric potential is connected to a relay (not shown) via the bus bar 21b. A positive terminal of the battery 21 at a rear side of a lower side which is highest in electric potential, is connected to the bus bar 28 of the battery box 20 via, for example, an electric wire 21c, and connected to an electrode terminal 63 of the electric power control unit 60 via the bus bar 28. That is, the other end side of the bus bar 28 provided to extend over a range from the floor portion 27 of the battery box 20 to the rear wall portion 26 as described above, is raised up along the inner surface of the rear wall portion 26. The connecting portion 28b at the upper end is located in the vicinity of the opening of the battery box 20. The connecting portion 28b at the upper end is connected to the negative terminal of the battery 21 at the upper side by an electric wire 21c.

The right battery module is configured like the left battery module, although this will not be described in detail. The three batteries 21 are integrally coupled to each other and electrically connected in series. A positive terminal of the battery 21 at an upper side which is highest in electric potential is connected to a relay, while a negative terminal of the battery 21 at a rear side of a lower side which is lowest in electric potential is connected to the electrode terminal 63 of the electric power control unit 60 via the bus bar 28. That is, in this example, the right and left battery modules are connected in series via the relay, and a voltage of each module is set to about a half of a high voltage required to drive the electric motorcycle 1.

In a state in which the three batteries 21 corresponding to the left module and the three batteries 21 corresponding to the right module are accommodated into the battery accommodating box 20, there is a gap which becomes a passage of the traveling wind between the right and left modules. Since the electrodes 21a and the bus bars 21b connecting them are placed on the inner side surfaces of the batteries 21 facing this gap, they are directly exposed to the traveling wind and thereby effectively cooled.

Mounting Structure of Electric Power Control Unit

As described above, in the present embodiment, the electric power control unit 60 is mounted to the battery box 20 from below. Since the battery box 20 made of a resin intervenes between the main frame 8 and the electric power control unit 60, the electric power control unit 60 can be supported in a vibration-proof manner. In addition, as will be described below, the case 62 of the electric power control unit 60 is joined to the floor portion 27 of the battery box 20 from below, and thus, the high-voltage line of the battery box 20 is connected to the high-voltage line of the electric power control unit 60 in a state in which they are isolated from their surroundings.

Figure 3:
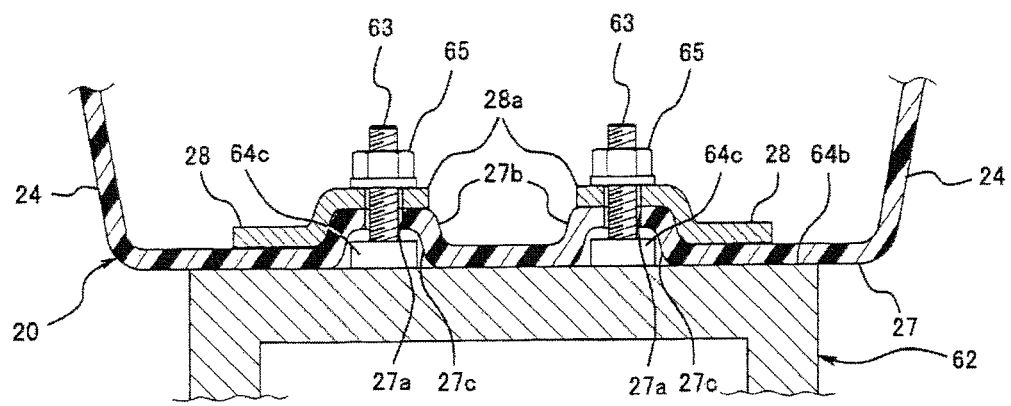
FIG. 3 is an enlarged view showing a connecting structure of an electrode terminal.

As schematically shown in FIG. 2, the case 62 of the electric power control unit 60 has a flat rectangular shape. A pair of positive and negative electrode terminals 63 connected to the power module 61 accommodated into the case 62 protrude upward from an upper wall portion 64 of the case 62. The floor portion 27 of the battery box 20 has the insertion holes 27a formed by the pair of circular holes such that the insertion holes 27a penetrate the floor portion 27 and correspond to the pair of electrode terminals 63, respectively. As shown in FIG. 3 in an enlarged manner, the electrode terminals 63 inserted into the insertion holes 27a from below protrude upward from the floor portion 27 of the battery box 20 and are connected to the connecting portions 28a of the bus bars 28, respectively.

More specifically, protruding portions 64a protruding substantially horizontally in the forward and rearward direction are provided at four corners of the upper wall portion 64 of the case 62 of the electric power control unit 60. The protruding portions 64a have through holes into which bolts are inserted to fasten the case 62 to the floor portion 27 of the battery box 20. The upper wall portion 64 of the case 62 has a flat surface 64b (joint surface) at one side (forward side in a state in which the case 62 is built into the electric motorcycle 1) in a lengthwise direction. The flat surface 64b is joined to the flat lower surface of the floor portion 27 of the battery box 20.

In addition, in the example illustrated, rectangular seat portions 64c swelling upward are provided on relatively inward regions (inward regions surrounded by the joint surfaces) of the flat surface 64b of the upper wall portion 64 of the case 62. The electrode terminals 63 protrude from upper surfaces of the seat portions 64c, respectively. As shown in FIG. 3 in an enlarged manner, the floor portion 27 of the battery box 20 has protruding portions 27b swelling upward to surround the insertion holes 27a, and recesses 27c are formed on reverse surfaces of the protruding portions 27b to contain the seat portions 64c, respectively.

The case 62 of the electric power control unit 60 is mounted to the floor portion 27 of the battery box 20 from below. The case 62 is fastened to the floor portion 27 of the battery box 20 by bolts penetrating the protruding portions 64a at four corners of the upper wall portion 64, respectively. Thereby, as shown in FIG. 3, the electrode terminals 63 are inserted into the insertion holes 27a of the floor portion 27 of the battery box 20, respectively, from below, and the seat portions 64c of the upper wall portion 64 of the case 62 are accommodated into the recesses 27c of the floor portion 27, respectively. The lower surface of the floor portion 27 and the flat surface 64b of the upper wall portion 64 of the case 62 are joined together so as to surround the seat portions 64c.

That is, the electrode terminals 63 applied with high voltages are surrounded by the joint surface of the battery box 20 and the joint surface of the case 62 and thereby are isolated from the surroundings. Thereby, a high level of safety is achieved. In addition, rain water, mud, and the like are less likely to enter the joint surface of the battery box 20 and the joint surface of the case 62. If a little rain water or the like enters a clearance between the joint surfaces, it is less likely to reach upper surfaces of the seat portions 64c which are higher than the joint surfaces. Therefore, the rain water or the like having entered the clearance between the joint surfaces is less likely to contact the electrode terminals 63.

The electrode terminals 63 are inserted into the insertion holes 27a, respectively, from below, as described above, penetrate the connecting portions 28a of the bus bars 28 surrounding the insertion holes 27a, and protrude upward, respectively. Male threads are formed on outer peripheries of the electrode terminals 63, respectively. Nuts 65 threadingly engaged with the male threads tighten the connecting portions 28a of the corresponding bus bars 28, respectively. If the rain water or the like enter the battery box 20, or water droplets stay in the floor portion 27 of the battery box 20, the water is less likely to contact the electrode terminals 63 and the connecting portions 28a of the bus bars 28 which are located above the upper surfaces of the protruding portions 27b.

Therefore, in accordance with the structure for mounting the electric power control unit 60 to the battery box 20 as described above, the electrode terminals 63 protruding from the case 62 of the electric power control unit 60 are inserted into the insertion holes 27a of the floor portion 27 of the battery box 20 and are connected to the bus bars 28 attached inside thereof. Therefore, the high-voltage lines between the batteries 21 and the power module 61 are minimized in length, and not exposed to outside, which eliminates a need for a cover or the like covering the high-voltage lines.

The insertion holes 27a are formed in the floor portion 27 of the battery box 20 which opens upward, and the electrode terminals 63 of the electric power control unit 60 mounted to the battery box 20 from below protrude upward. Therefore, before the batteries 21 are accommodated into the battery box 20, an operator can carry out a connecting work in an easy attitude with the operator's hands inserted into the battery box 20 from above, while seeing an interior of the battery box 20 from above and visually checking the electrode terminals 63 and the connecting portions 28a of the bus bars 28.

Figure 4:
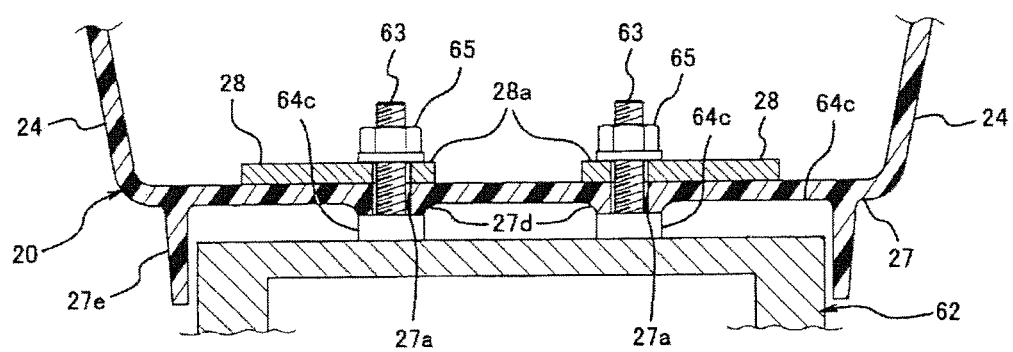
FIG. 4 is a view showing a modified example of the connecting structure, corresponding to FIG. 3.

Instead of accommodating the seat portions 64c of the case 62 into the recesses 27c of the floor portion 27 of the battery box 20 from below, as described above, as exemplarily shown in FIG. 4, boss portions 27d protruding downward from the floor portion 27 of the battery box 20 may be provided to face the seat portions 64c of the case 62, and the seat portions 64c may be butted with the boss portions 27d from below, respectively. In that case, wall portions 27e extending vertically downward from the floor portion 27 of the battery box 20 may be provided to surround the entire periphery of the upper portion of the case 62 of the electric power control unit 60. By providing the wall portions 27e extending vertically downward, it becomes possible to suppress rain water, mud, and the like from entering a clearance between the battery box 20 and the case 62.

Structure for Cooling Electric Power Control Unit

Figure 5:
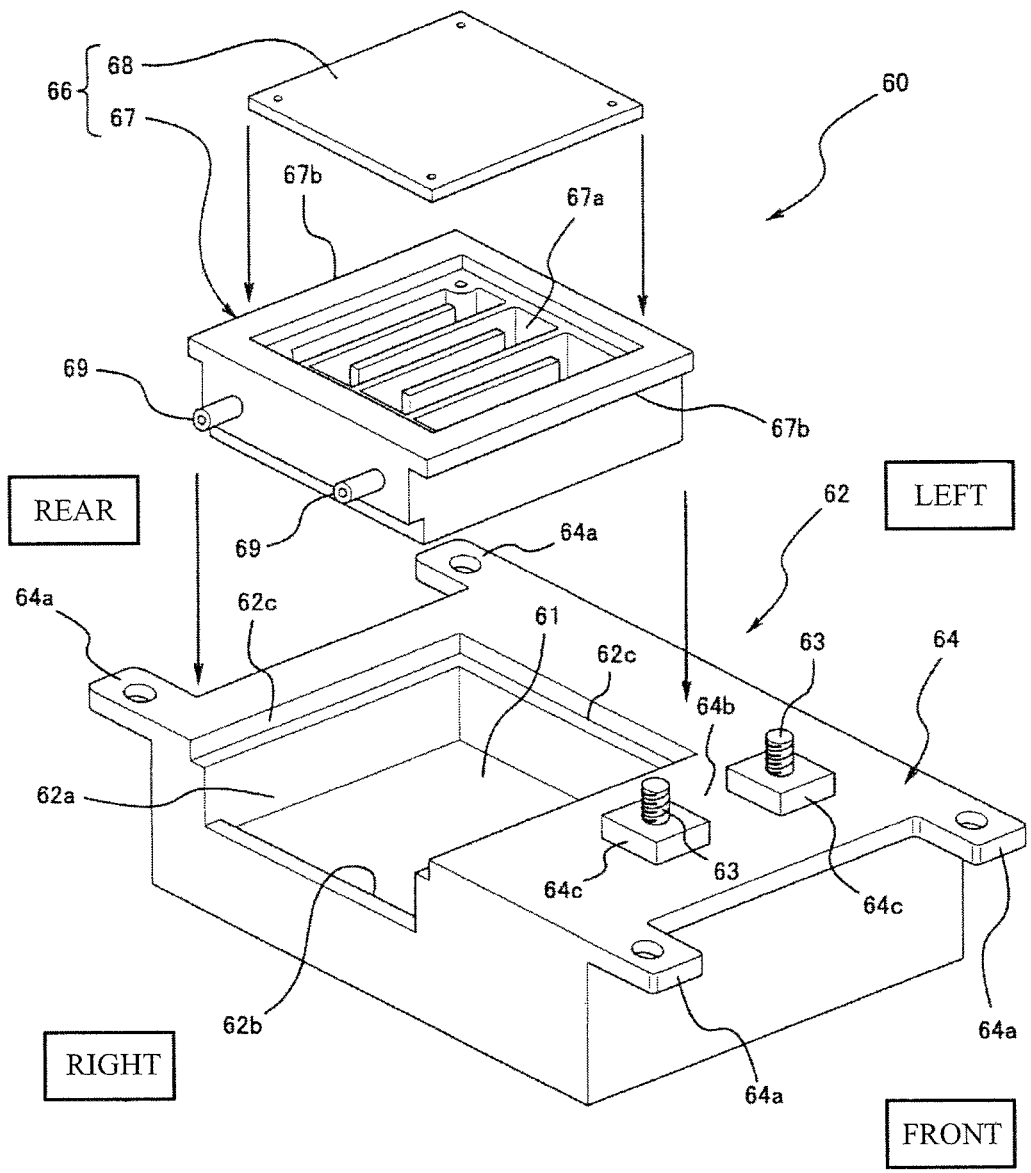
FIG. 5 is a perspective view of a structure for mounting a cooler to an electric power control unit.
Figure 6:
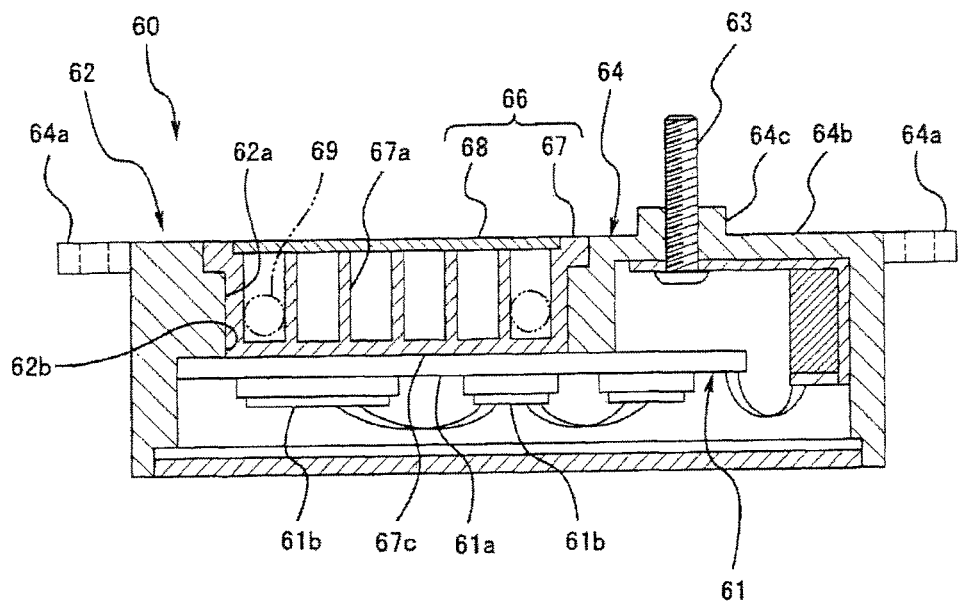
FIG. 6 is a cross-sectional view showing a structure for cooling the electric power control unit.

Next, the structure for cooling the electric power control unit 60 mounted to the battery box 20 as described above will be described with reference to FIGS. 5 and 6. FIG. 5 is a perspective view of a structure for mounting the cooler 66 as a separate component to the electric power control unit 60. FIG. 6 is a cross-sectional view showing the structure for cooling the power module 61 by the cooler 66.

As described above with reference to FIG. 2, the case 62 of the electric power control unit 60 on the whole has a flat rectangular shape. The flat surface 64b to be joined to the floor portion 27 of the battery box 20 is provided at one side (rearward side in a state in which the case 62 is mounted in the electric motorcycle 1, hereinafter, the terms "forward side" and "rearward side" are simply used) in a lengthwise direction of the upper wall portion 64. As shown in FIG. 5, at the rearward side of the flat surface 64b, there is provided a fitting portion 62a having a rectangular cross-section which is recessed from an upper surface to a right side surface. The cooler 66 is fitted into the fitting portion 62a.

As described above, the lower surface of the battery box 20 protrudes downward and obliquely forward relative to the lower pipe member 80 of the main frame 8. Therefore, the electric power control unit 60 mounted to the lower surface of the battery box 20 is directly applied with the traveling wind from forward and thereby is cooled efficiently. In addition to this, in the present embodiment, the power module 61 which generates heat of a great amount is cooled by the dedicated cooler 66.

As shown in FIG. 5, a bottom of the fitting portion 62a opens inside the case 62 of the electric power control unit 60. The cooler 66 is mounted to close the opening 62b from outward. As shown in FIG. 6, the power module 61 is disposed inside of the case 62 so as to close the opening 62b from inward. A lower wall (i.e., lower wall 67c of a casing 67 of the cooler 66) is in contact with a substrate 61a of the power module 61 from above. A heat radiation grease having a high electric conductivity is applied between the lower wall of the cooler 66 and the substrate 61a.

As shown in FIG. 6, a power semiconductor chip 61b such as an IGBT is mounted to the substrate 61a of the power module 61, and faces the opening 62b of the case 62 of the electric power control unit 60 such that its reverse surface is directed upward. In a state in which the cooler 66 mounted so as to close the opening 62b from above is in contact with the substrate 61a of the power module 61, heat exchange occurs between the substrate 61a and oil flowing through a passage 67a inside of the cooler 66.

As shown in FIG. 5, the cooler 66 includes a casing 67 which is substantially equal in size to the fitting portion 62a of the case 62 of the electric power control unit 60, and a lid member 68 of a rectangular plate shape which closes an upper opening of the casing 67. The casing 67 and the lid member 68 are manufactured by molding, for example, aluminum alloy. A flange 67b is provided along a front edge, a rear edge, and a left edge of an upper portion of the casing 67. The flange 67b is internally fitted to a stepped portion 62c formed along a front edge, a rear edge and a left edge of the fitting portion 62a of the case 62 of the electric power control unit 60, and fastened to it by screws, or the like, (not shown). That is, the cooler 66 is detachably attached to the case 62.

The casing 67 of the cooler 66 is provided with the passage 67a through which cooling oil flows. The passage 67a extends from a right front corner of the casing 67 toward a left end, then turns back at the left end, then extends toward a right end, then turns back at the right end, and then extends toward the left end again. Thus, the passage 67a has a labyrinth structure which guides the oil in a rearward direction while turning back the flow of the oil at the right end and at the left end. Pipe members 69 are provided to penetrate a forward portion and a rearward portion of a right side wall of the casing 67 so as to correspond to an inlet and an outlet of the passage 67a, respectively.

As can be seen from FIG. 1, the upper hose 72 is coupled to the forward pipe member 69. The oil flowing from the oil cooler 70 is introduced into the passage 67a via the upper hose 72. The return hose 73 is coupled to the rearward pipe member 69. The oil flowing out of the passage 67a flows downward into the motor unit 50 through the return hose 73. The oil flows through the passage 67a while being turned back at the right end and at the left end as described above, which makes it easier to separate a boundary layer of the oil from a wall surface of the passage 67a. This can increase an efficiency of the heat exchange between the cooler 66 and the power module 61.

As shown in FIG. 6, the opening 62b of the case 62 of the electric power control unit 60 which is closed by the casing 67 of the cooler 66 as described above has a smaller size than the substrate 61a of the power module 61. The opening 62b is formed on a portion of the substrate 61a, to be precise, in a location corresponding to the power semiconductor chip 61b such as the IGBT. That is, the cooler 66 is configured not to cool the entire substrate 61a but to concentrically cool the power semiconductor chip 61b which generates heat of a great amount. Because of this, a size of the cooler 66 can reduced, and an amount of the oil flowing through the cooler 66 can be reduced.

The power module 61 is accommodated into the case 62 such that the substrate 61a is oriented upward. The cooler 66 to which the upper surface of the substrate 61a is joined efficiently cools the power module 61. The heat radiated from the substrate 61a in a downward direction is dispersed from the wall portion of the case 62. That is, the upper portion of the case 62 joined to the floor portion 27 of the battery box 20 can be cooled by the cooler 66, while the lower portion of the case 62 can be cooled by the traveling wind.

In accordance with the above described cooling structure of the electric power control unit 60 in the electric motorcycle 1, the cooler 66 is mounted to the opening 62b formed in the case 62 from outward so as to contact the substrate 61a of the power module 61 which generates heat of a great amount, thereby cooling the power module 61 efficiently. Therefore, the size of the cooler 66 is reduced in size while ensuring a required cooling capability, and an amount of the cooling oil is reduced, which can suppress a weight increase and a cost increase.

The cooler 66 is provided not to cool the entire substrate 61a of the power module 61 but so as to correspond to the power semiconductor chip 61b which generates heat of a great amount to concentrically cool the power semiconductor chip 61b. Therefore, the size of the cooler 66 can be minimized and the amount of the oil can be reduced. In addition, the case 62 can be cooled by utilizing the traveling wind as a whole, which can further reduce the size of the cooler 66.

Since the lubricating oil of the motor unit 50 is used as the oil which is the coolant, a weight increase and a cost increase can be suppressed. Since the electric power control unit 60 is placed immediately above the motor unit 50, a loss caused by actuation of the oil pump 52 for feeding the oil with a pressure to the cooler 66 is less.

Furthermore, since the cooler 66 is separate from the case 62 of the electric power control unit 60, a desired and sufficient cooling capability can be ensured merely by changing the cooler 66 while using the same case 62, even in a case where a desired cooling capability changes depending on the weight of the electric motorcycle 1, the size of the driving motor 30, etc.

Since the cooler 66 is detachably attached to the case 62, for example, only the cooler 66 is detached from the case 62 during the maintenance, or the substrate 61a of the power module 61 with the cooler 66 attached to the case 62 can be detached. Thus, maintenance can be carried out easily.

Figure 7:
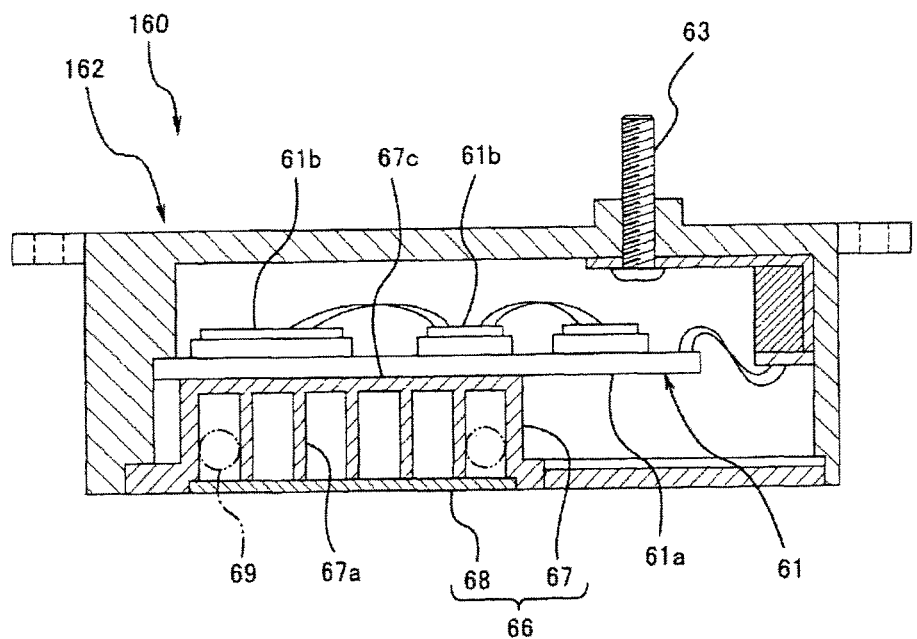
FIG. 7 is a view showing a modified example of the cooling structure, corresponding to FIG. 6.

Instead of placing the cooler 66 in the upper portion of the case 62 of the electric power control unit 60, for example, as shown in FIG. 7, the cooler 66 may be placed in a lower portion inside of a case 162 in an electronic power control unit 160. In this construction, a loss caused by actuation of the oil pump 52 for feeding the oil with a pressure to the cooler 66 can be further lessened in the layout in which the electric power control unit 160 is placed above the motor unit 50.

Other Embodiment

The above described embodiment is merely exemplary, and is in no way intended to limit the present invention, its applications, and its uses. For example, although in the present embodiment, the opening 62b formed in the case 62 of the electric power control unit 60 has a smaller size than the substrate 61a of the power module 61, and the cooler 66 is provided so as to correspond to the power semiconductor chip 61b, the present invention is not limited to this. The opening 62b may be designed to have a size which is substantially equal to that of the substrate 61a of the power module 61, to cool the entire substrate 61a.

The case 62 is not necessarily provided with the fitting portion 62a, and the cooler 66 may be mounted such that the cooler 66 protrudes outward from the wall portion provided with the opening. The cooler 66 is not necessarily detachably attachable to the case 62. The cooler 66 is not limited to the separate cooler 66, and the case may be integrally provided with the cooling jacket.

Figure 8:
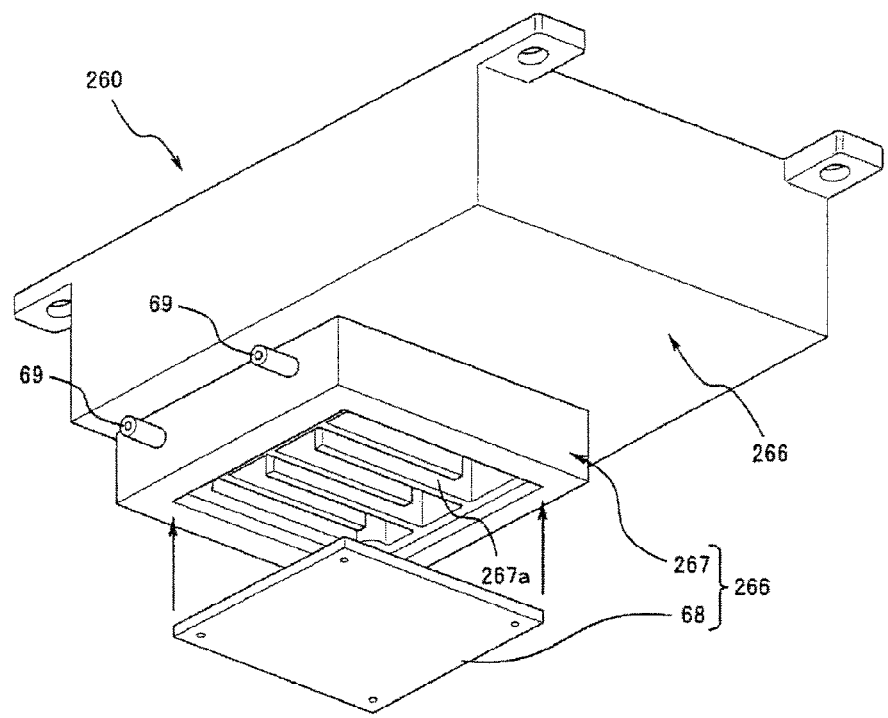
FIG. 8 is a perspective view showing an electric power control unit according to another embodiment in which a case is integrally provided with a cooling jacket, when viewed from below.
Figure 9A:
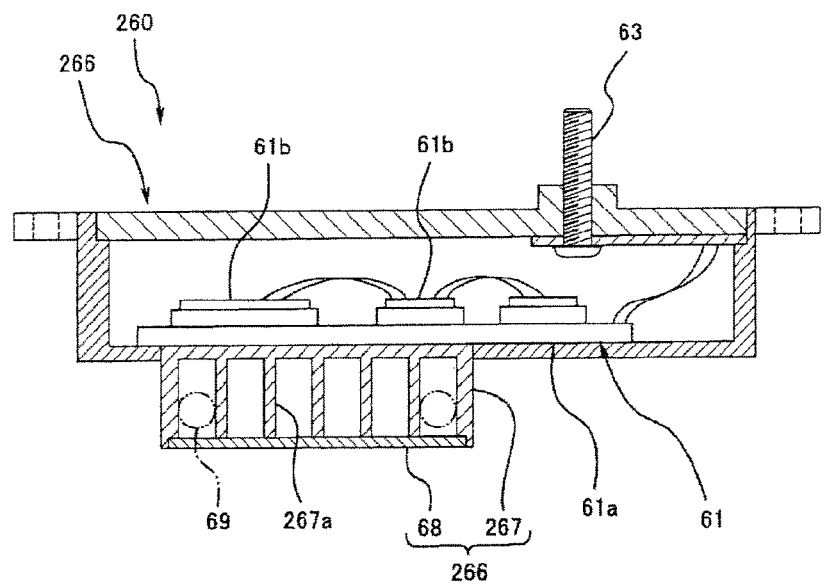
FIG. 9A is a view of the electric power control unit according to another embodiment, corresponding to FIG. 6.
Figure 9B:
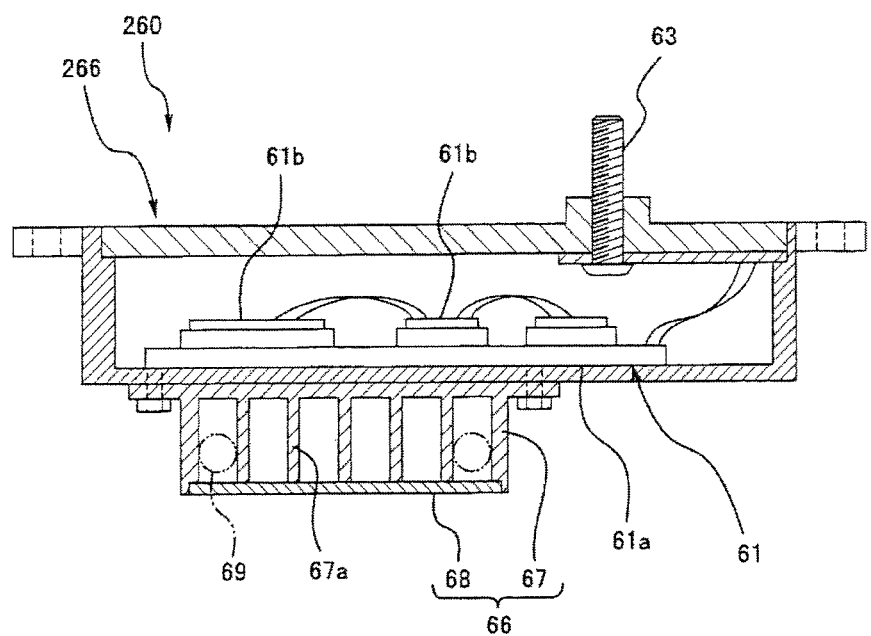
FIG. 9B is a view of the electric power control unit according to modified example of another embodiment, corresponding to FIG. 9A.

FIGS. 8 and 9A show examples in which a case 262 of an electric power control unit 260 is integrally provided with a cooling jacket 266. The cooling jacket 266 is configured such that a casing member 267 thereof protrudes downward from a lower surface of the case 262. A passage 267a having a labyrinth structure is formed inside of the casing member 267. The casing member 267 and the passage 267a have the same structure as that of the casing 67 of the cooler 66 according the present embodiment and the modified example. An opening formed on a lower portion of the casing member 267 is closed by the lid member 68 of a rectangular plate shape. FIG. 9B shows a modified example in which the cooler 66 which is a separate component is mounted to the case 262 such that the cooler 66 protrudes downward from the lower surface of the case 262, like the cooling jacket 266.

It is not necessary to mount the case 62 of the electric power control unit 60 to the floor portion 27 of the battery box 20. For example, the case 62 may be mounted to the rear wall portion 26 from behind. Since the oil is fed with a pressure from the motor unit 50, the case 62 is preferably positioned closer to the motor unit 50 and as low as possible.

It is not necessary to use the oil in the motor unit 50 as the coolant. A coolant different from the oil in the motor unit 50 may be used. Even in a case where the oil is used, the oil cooler 70 may be omitted. This is because heat radiation is achieved by circulating the oil of a desired amount to disperse the heat generated in the electric power control unit 60 without actively performing the heat exchange with the traveling wind in the oil cooler 70.

Although in the above embodiment, the electric motorcycle 1 has been described, the electric vehicle of the present invention is not limited to the motorcycle, but may be, for example, ATV (all terrain vehicle), a small truck, etc.

INDUSTRIAL APPLICABILITY

As described above, a saddle-type electric vehicle of the present invention is capable of ensuring a desired cooling capability by effectively liquid-cooling a power module in an electric power control unit, while suppressing a weight increase and a cost increase. Therefore, the saddle-type electric vehicle is very useful in the electric motorcycle.

REFERENCE CHARACTERS LIST 1 electric motorcycle (electric vehicle)
5 head pipe
8 main frame
20 battery box (accommodating box of electric storage device)
21 battery (electric storage device)
27 floor portion of battery box
30 driving motor (electric motor)
40 transmission (power transmission mechanism)
50 motor unit
52 oil pump
60 electric power control unit (electric power controller)
61 power module
61a substrate
62 case
62a fitting portion
62b opening
66 cooler (cooling jacket)
67 casing
67a passage
67c lower wall of casing (wall portion which coolant contacts)
71 lower hose (oil feeding line)
72 upper hose (oil feeding line)
73 return hose (oil return line)

The invention claimed is:

1. A saddle-type electric vehicle comprising:
an electric motor for driving the saddle-type electric vehicle; and
an electric power controller for controlling electric power supply to the electric motor;
wherein a substrate of a power module to which a semiconductor element is mounted is in a case of the electric power controller;
wherein the case of the electric power controller is provided with a cooling jacket which is in contact with at least a portion of the substrate;
wherein an electric storage device for storing electric power supplied to the electric motor is accommodated into an accommodating box; and
wherein the cooling jacket is coupled to the accommodating box via the case of the electric power controller.

2. The saddle-type electric vehicle according to claim 1, wherein the cooling jacket is mounted to close an opening formed in the case of the electric power controller such that the cooling jacket is in contact with at least a portion of the substrate of the power module.

3. The saddle-type electric vehicle according to claim 2, wherein the cooling jacket is detachably attached to the case of the electric power controller.

4. The saddle-type electric vehicle according to claim 2, wherein the case of the electric power controller is provided with a fitting portion into which the cooling jacket is fitted from outward; and
wherein the opening is formed within the fitting portion.

5. The saddle-type electric vehicle according to claim 2, wherein the cooling jacket includes a passage having a labyrinth structure in which a flow of a coolant is turned back.

6. The saddle-type electric vehicle according to claim 2, wherein the opening of the case of the electric power controller has a smaller size than the substrate of the power module and is formed on a portion of the substrate which portion corresponds to a power semiconductor chip on the substrate.

7. The saddle-type electric vehicle according to claim 6, wherein a cooler is jointed to an upper surface of the substrate and heat radiated from the substrate in a downward direction is dispersed from a wall portion of the case.

8. The saddle-type electric vehicle according to claim 1, wherein the cooling jacket faces the accommodating box.

9. The saddle-type electric vehicle according to claim 1, wherein the cooling jacket is located at a location that corresponds to a location of the electric storage device accommodated in the accommodating box.

10. The saddle-type electric vehicle according to claim 1, wherein the cooling jacket is sandwiched between the accommodating box and the case of the electric power controller.

11. The saddle-type vehicle according to claim 1, wherein a pair of positive and negative electrode terminals connected to the power module protrude from a wall portion of the case of the electric power controller;
wherein a floor portion of the accommodating box has insertion holes formed such that the insertion holes correspond to the pair of electrode terminals respectively; and
wherein the electrode terminals inserted into the insertion holes protrude into the accommodating box and are respectively connected to bus bars which connect to the electric storage device.

12. The saddle-type electric vehicle according to claim 11,
wherein swelling seat portions are provided on the wall portion of the case of the electric power controller and the electrode terminals protrude from the seat portions;
wherein recesses are formed on the floor portion of the accommodating box; and
wherein the seat portions are accommodated into the recesses respectively in a state where the electrode terminals are inserted into the insertion holes of the floor portions of the accommodating box.

13. The saddle-type electric vehicle according to claim 1, further comprising a vehicle body frame that includes a head pipe and a main frame extending rearward from the head pipe,
wherein the electric power controller is mounted to a portion of the lower surface of the accommodating box which portion is in a range from center to front portion of the accommodating box;
wherein the electric power controller receives traveling wind flowing through a space between right and left hanger brackets which extend downward from a front portion of the main frame and support the electric motor.

14. A saddle-type electric vehicle comprising:
an electric motor for driving the saddle-type electric vehicle; and
an electric power controller for controlling electric power supply to the electric motor;
wherein a substrate of a power module to which a semiconductor element is mounted is in a case of the electric power controller;
wherein the case of the electric power controller is provided with a cooling jacket which is in contact with at least a portion of the substrate;
wherein the saddle-type electric vehicle includes a head pipe and a main frame extending rearward from the head pipe such that the main frame is inclined downward;
wherein a plurality of electric storage devices for storing electric power supplied to the electric motor are accommodated into an accommodating box which is mounted to the main frame; and
wherein the case of the electric power controller is mounted to a lower surface of the accommodating box, and the cooling jacket is placed in an upper portion within the case.

15. The saddle-type electric vehicle according to claim 14,
wherein the cooling jacket is mounted to close an opening formed in the case of the electric power controller such that the cooling jacket is in contact with at least a portion of the substrate of the power module.

16. A saddle-type electric vehicle comprising:
an electric motor for driving the saddle-type electric vehicle; and
an electric power controller for controlling electric power supply to the electric motor;
wherein a substrate of a power module to which a semiconductor element is mounted is in a case of the electric power controller;
wherein the case of the electric power controller is provided with a cooling jacket which is in contact with at least a portion of the substrate;
wherein a motor unit that includes the electric motor and a power transmission mechanism for transmitting an output of the electric motor is provided with an oil pump which discharges lubricating oil;
wherein the electric power controller is disposed above the motor unit; and
wherein the cooling jacket of the electric power controller is provided with an oil feeding line through which the oil is fed as a coolant from the oil pump, and an oil return line through which the oil discharged from the cooling jacket flows downward to the motor unit.

17. The saddle-type electric vehicle according to claim 16,
wherein the cooling jacket is disposed in a lower portion inside of the case of the electric power controller.

18. The saddle-type electric vehicle according to claim 16,
wherein the cooling jacket is mounted to close an opening formed in the case of the electric power controller such that the cooling jacket is in contact with at least a portion of the substrate of the power module.

* * * * *